United States Patent
Imahayashi et al.

(10) Patent No.: US 8,785,259 B2
(45) Date of Patent: Jul. 22, 2014

(54) ORGANIC TRANSISTOR, MANUFACTURING METHOD OF SEMICONDUCTOR DEVICE AND ORGANIC TRANSISTOR

(71) Applicant: Semiconductor Energy Laboratory Co., Ltd., Atsugi (JP)

(72) Inventors: Ryota Imahayashi, Atsugi (JP); Shinobu Furukawa, Atsugi (JP); Atsuo Isobe, Atsugi (JP); Yasuyuki Arai, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/722,028

(22) Filed: Dec. 20, 2012

(65) Prior Publication Data
US 2013/0105784 A1    May 2, 2013

Related U.S. Application Data

(62) Division of application No. 12/850,652, filed on Aug. 5, 2010, now Pat. No. 8,343,816, which is a division of application No. 11/405,514, filed on Apr. 18, 2006, now abandoned.

(30) Foreign Application Priority Data

Apr. 25, 2005  (JP) .................................. 2005-125930

(51) Int. Cl.
*H01L 21/00*  (2006.01)

(52) U.S. Cl.
USPC ................ 438/149; 257/40; 438/151; 438/99

(58) Field of Classification Search
USPC ............................................ 437/149, 151, 99
See application file for complete search history.

(56) References Cited

U.S. PATENT DOCUMENTS

| | | |
|---|---|---|
| 4,727,044 A | 2/1988 | Yamazaki |
| 5,485,019 A | 1/1996 | Yamazaki et al. |
| 5,757,456 A | 5/1998 | Yamazaki et al. |
| 5,956,581 A | 9/1999 | Yamazaki et al. |
| 6,127,199 A | 10/2000 | Inoue et al. |

(Continued)

FOREIGN PATENT DOCUMENTS

| | | |
|---|---|---|
| CN | 1495931 | 5/2004 |
| EP | 1 398 840 | 3/2004 |

(Continued)

*Primary Examiner* — Jae Lee
(74) *Attorney, Agent, or Firm* — Eric J. Robinson; Robinson Intellectual Property Law Office, P.C.

(57) ABSTRACT

It is an object to form a high quality gate insulating film which is dense and has a strong insulation resistance property, and to propose a high reliable organic transistor in which a tunnel leakage current is little. One mode of the organic transistor of the present invention has a step of forming the gate insulating film by forming the conductive layer which becomes the gate electrode activating oxygen (or gas including oxygen) or nitrogen (or gas including nitrogen) or the like using dense plasma in which density of electron is $10^{11}$ cm$^{-3}$ or more, and electron temperature is a range of 0.2 eV to 2.0 eV with plasma activation, and reacting directly with a portion of the conductive layer which becomes the gate electrode to be insulated.

21 Claims, 10 Drawing Sheets

(56) References Cited

U.S. PATENT DOCUMENTS

| | | |
|---|---|---|
| 6,235,563 B1 | 5/2001 | Oka et al. |
| 6,297,103 B1 | 10/2001 | Ahn et al. |
| 6,368,988 B1 | 4/2002 | Li et al. |
| 6,426,245 B1 | 7/2002 | Kawasaki et al. |
| 6,519,136 B1 | 2/2003 | Chu et al. |
| 6,521,912 B1 | 2/2003 | Sakama et al. |
| 6,524,975 B2 | 2/2003 | Li et al. |
| 6,534,420 B2 | 3/2003 | Ahn et al. |
| 6,534,421 B2 | 3/2003 | Kakkad |
| 6,534,826 B2 | 3/2003 | Yamazaki |
| 6,548,380 B1 | 4/2003 | Goto et al. |
| 6,555,420 B1 | 4/2003 | Yamazaki |
| 6,638,810 B2 | 10/2003 | Bakli et al. |
| 6,664,577 B2 | 12/2003 | Takayanagi |
| 6,716,761 B2 | 4/2004 | Mitsuiki |
| 6,747,287 B1 | 6/2004 | Toguchi et al. |
| 6,773,996 B2 | 8/2004 | Suzawa et al. |
| 6,773,999 B2 | 8/2004 | Yoneda |
| 6,818,852 B2 | 11/2004 | Ohmi et al. |
| 6,919,282 B2 | 7/2005 | Sakama et al. |
| 6,949,425 B2 | 9/2005 | Takayanagi |
| 6,953,744 B2 | 10/2005 | Kim et al. |
| 6,975,018 B2 | 12/2005 | Ohmi et al. |
| 7,001,855 B2 | 2/2006 | Ohmi et al. |
| 7,026,032 B2 | 4/2006 | Lee et al. |
| 7,081,640 B2 | 7/2006 | Uchida et al. |
| 7,097,735 B2 | 8/2006 | Ohmi et al. |
| 7,098,525 B2 | 8/2006 | Bai et al. |
| 7,164,178 B2 | 1/2007 | Yoneda |
| 7,166,899 B2 | 1/2007 | Sakama et al. |
| 7,172,934 B2 | 2/2007 | Mutou |
| 7,205,716 B2 | 4/2007 | Yamazaki et al. |
| 7,211,679 B2 | 5/2007 | Gerlach et al. |
| 7,230,267 B2 | 6/2007 | Nagayama et al. |
| 7,250,375 B2 | 7/2007 | Nakanishi et al. |
| 7,303,792 B2 | 12/2007 | Hosaka et al. |
| 7,303,945 B2 | 12/2007 | Seko et al. |
| 7,339,315 B2 | 3/2008 | Suh et al. |
| 7,364,954 B2 | 4/2008 | Kuwashima et al. |
| 7,375,396 B2 | 5/2008 | Lee et al. |
| 7,396,748 B2 | 7/2008 | Takayanagi |
| 7,399,989 B2 | 7/2008 | Moriya et al. |
| 7,410,839 B2 | 8/2008 | Isobe et al. |
| 7,439,194 B2 | 10/2008 | Ahn et al. |
| 7,465,677 B2 | 12/2008 | Isobe et al. |
| 7,482,248 B2 | 1/2009 | Tamura |
| 7,732,808 B2 | 6/2010 | Ikeda et al. |
| 2002/0020497 A1 | 2/2002 | Ohmi et al. |
| 2002/0101154 A1 | 8/2002 | Seo et al. |
| 2003/0197505 A1* | 10/2003 | Sakakima et al. ............ 324/252 |
| 2004/0108562 A1* | 6/2004 | Nagayama et al. ........... 257/434 |
| 2004/0124416 A1 | 7/2004 | Knipp et al. |
| 2004/0217431 A1 | 11/2004 | Shimada |
| 2004/0238895 A1 | 12/2004 | Mutou |
| 2005/0124174 A1* | 6/2005 | Ahn et al. ..................... 438/785 |
| 2005/0158665 A1 | 7/2005 | Maekawa et al. |
| 2005/0196973 A1 | 9/2005 | Suzuki et al. |
| 2005/0285102 A1 | 12/2005 | Koo et al. |
| 2006/0055314 A1 | 3/2006 | Nakamura et al. |
| 2006/0154492 A1 | 7/2006 | Ide et al. |
| 2006/0205172 A1 | 9/2006 | Gerlach et al. |
| 2006/0246633 A1 | 11/2006 | Arai et al. |
| 2006/0246644 A1 | 11/2006 | Isobe et al. |
| 2007/0063273 A1 | 3/2007 | Yoneda |
| 2007/0163713 A1 | 7/2007 | Kasai et al. |
| 2007/0204959 A1 | 9/2007 | Nakanishi et al. |
| 2008/0032511 A1 | 2/2008 | Kabe et al. |
| 2008/0048183 A1 | 2/2008 | Ohsawa et al. |
| 2008/0191611 A1 | 8/2008 | Iwaki et al. |
| 2009/0026922 A1 | 1/2009 | Iwaki et al. |

FOREIGN PATENT DOCUMENTS

| | | |
|---|---|---|
| EP | 1 617 483 | 1/2006 |
| EP | 1 622 194 | 2/2006 |
| JP | 06-013615 | 1/1994 |
| JP | 06-338492 A | 12/1994 |
| JP | 08-254686 | 10/1996 |
| JP | 10-125929 | 5/1998 |
| JP | 2000-174277 | 6/2000 |
| JP | 2001-135824 | 5/2001 |
| JP | 2002-217170 | 8/2002 |
| JP | 2002-261091 | 9/2002 |
| JP | 2002-359371 A | 12/2002 |
| JP | 2003-124472 A | 4/2003 |
| JP | 2003-133550 A | 5/2003 |
| JP | 2004-107651 A | 4/2004 |
| JP | 2004-235277 A | 8/2004 |
| JP | 2004-319952 | 11/2004 |
| JP | 2004-335756 A | 11/2004 |
| JP | 2005-026468 A | 1/2005 |
| JP | 2005-093633 A | 4/2005 |
| JP | 2005-093737 | 4/2005 |
| WO | WO 03/015151 | 2/2003 |
| WO | WO 2004/017396 | 2/2004 |
| WO | WO 2004/018539 | 3/2004 |
| WO | WO 2005/004223 | 1/2005 |

* cited by examiner

ORGANIC TRANSISTOR, MANUFACTURING METHOD OF SEMICONDUCTOR DEVICE AND ORGANIC TRANSISTOR

BACKGROUND OF THE INVENTION

1. Field of the Invention

The present invention relates to an organic transistor and a manufacturing method of an organic transistor having an organic semiconductor layer and a semiconductor device having an organic transistor.

2. Description of the Related Art

A field-effect transistor controls an electric conductivity of a semiconductor layer which is provided between source and drain electrodes with a voltage applied to a gate electrode, and a field-effect transistor is a representative one of unipolar elements using carrier transport of either holes or electrons.

Since various kinds of switching elements and amplifying elements can be formed depending on a combination of such field-effect transistors, these field-effect transistors are applied in various fields. For example, a switching element of a pixel in an active matrix display or the like can be given as the application.

An inorganic semiconductor material represented by silicon has been used broadly as a semiconductor material using for the field-effect transistor. Since a high-temperature treatment is needed for forming a film of an inorganic semiconductor material as a semiconductor layer, it is difficult to use plastic or a film as a substrate.

In contrast with this, since a film can be formed at even low temperature relatively, a field-effect transistor can be manufactured in principle over a substrate of which heat endurance is low such as a plastic substrate as well as a glass substrate when an organic semiconductor material is used as a semiconductor layer.

An organic transistor which is formed by forming a film the semiconductor layer including the organic semiconductor material in a low temperature process is disclosed in Patent Document 1. Note that a gate insulating film of the organic transistor written in Patent Document 1 is formed by a plasma CVD method.

[Patent Document 1]
Japanese Patent Laid-Open No. 2000-174277

With a minituarization of the transistor, it is necessary to make the gate insulating film thinner at the same time as shortening a channel length. However, when the gate insulating film is made thinner, a tunnel leakage current is high, and there is a concern about degradation of reliability. Therefore, the gate insulating film which is a higher resistant property is needed.

BRIEF SUMMARY OF THE INVENTION

It is an object of the present invention to provide a lower tunnel leakage current organic transistor by forming a dense and highly insulating resistance property gate insulating film than the gate insulating film formed by using a conventional CVD method.

The present invention takes a method of hereinafter to accomplish the above object.

One mode of an organic transistor of the present invention is a transistor by obtained by forming a conductive layer which becomes a gate electrode; activating oxygen (or a gas including oxygen) or nitrogen (or a gas including nitrogen) or the like using dense plasma of which density of electrons is $10^{11}$ cm$^{-3}$ or more and electron temperature is a range of 0.2 eV to 2.0 eV by plasma activation; and forming the gate insulating film by reacting directly and insulating with a part of the conductive layer which becomes the gate electrode.

One mode of an organic transistor of the present invention is having a gate electrode, a gate insulating film, a semiconductor layer including an organic semiconductor material, in which source and drain electrodes, and the source and drain electrodes have a composite layer of an organic compound and a metal oxide and a conductive layer, and the gate insulating film is formed by performing dense plasma treatment to the conductive layer which becomes a gate electrode.

Another mode of an organic transistor of the present invention is having a gate electrode, a gate insulating film formed in contact with and over the gate electrode, a semiconductor layer including an organic semiconductor material formed over the gate insulating film, and source and drain electrodes over a semiconductor layer, in which the source and drain electrodes have a composite layer of an organic compound and a metal oxide and the conductive layer, the gate insulating film is formed by performing dense plasma treatment to the conductive layer which becomes the gate electrode.

Another mode of an organic transistor of the present invention is having a gate electrode, a gate insulating film formed over the gate electrode, a semiconductor layer including an organic semiconductor material formed over the gate insulating film, and source and drain electrodes over the semiconductor layer, in which the source and drain electrodes have a composite layer of an organic compound and a metal oxide and the conductive layer, and the gate insulating film is a film which is subjected to dense plasma treatment.

One of manufacturing methods of the organic transistor of the present invention includes a steps of forming a first conductive layer over a substrate, insulating a surface of the first conductive layer by dense plasma treatment, forming a semiconductor layer including an organic semiconductor material over the first insulated conductive film, forming a composite layer in which an organic compound and a metal oxide are mixed over the semiconductor layer and forming a second conductive layer over the composite layer. At this time, the composite layer and the second conductive layer are the source and drain electrodes, and a portion having a conductive property of the first conductive layer is a gate electrode, and a portion having an insulating property of the first conductive layer is a gate insulating film.

Another manufacturing method of an organic transistor of the present invention is forming a gate electrode over a substrate, forming a gate insulating film over a gate electrode, forming the semiconductor layer including an organic semiconductor material over the gate insulating film, forming a composite layer in which an organic compound and a metal oxide are mixed over the semiconductor layer, forming a layer over the composite layer. At this time, the composite layer and the conductive layer is the source and drain electrodes, and dense plasma treatment is performed to the gate insulating film.

Dense plasma treatment uses plasma in which density of electrons is $10^{11}$ cm$^{-3}$ or more and electron temperature is a range of 0.2 eV to 2.0 eV (more preferably, a range of 0.5 eV to 1.5 eV). Note that "dense plasma" in this specification may be also called "high density plasma".

The gate electrode may be any one of tantalum, niobium, aluminum, molybdenum, tungsten, titanium, copper, chromium, nickel, cobalt, and magnesium.

The gate insulating film may have dielectric constant of 8 or more.

The organic compound which forms the composite layer may have an aromatic amine skeleton.

The metal oxide which forms the composite layer may be one metal oxide or plural metal oxides selected from titanium, vanadium, chromium, zirconium, niobium, molybdenum, hafnium, tantalum, tungsten, and rhenium.

One mode of the semiconductor device of the present invention is that a circuit is formed by using an organic transistor in which an insulating film which is formed by using dense plasma in which density of electrons is $10^{11}$ cm$^{-3}$ or more, and electron temperature is a range of 0.2 eV to 2.0 eV (more preferably, a range of 0.5 eV to 1.5 eV) and a semiconductor layer including an organic semiconductor material are contacted.

Since a gate insulating film which is formed by using dense plasma can be a high quality film which is less damaged by plasma and has almost no defects, the gate insulating film can reduce a tunnel leakage current. Therefore, a highly reliable organic transistor can be obtained. In addition, when the conductive layer which becomes a gate electrode is insulated to be the gate insulating film, high integration is enabled.

DETAILED DESCRIPTION OF THE INVENTION

Figure 1A:
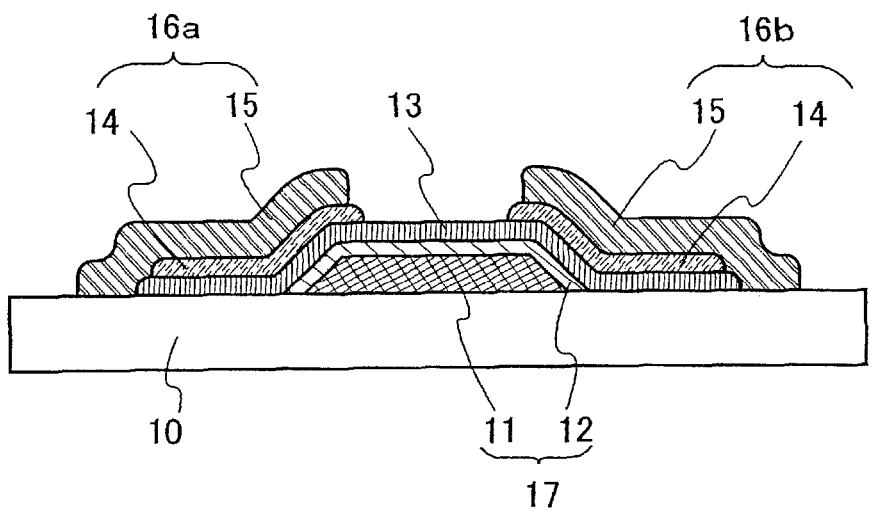
FIGS. 1A and 1B are diagrams explaining a configuration of an organic transistor of the present invention.

Embodiment Modes of the present invention are hereinafter described in detail with reference to the drawings. However, the present invention is not limited to the following description, and it is to be understood by those skilled in the art that the mode and detail of the present invention can be changed variously within the scope of the present invention. Therefore, the present invention should not be construed as being limited to the description of the following Embodiment Modes and Embodiments. Further, in the structures of the present invention hereinafter described, the same parts are denoted with the same reference numerals throughout the drawings.

Embodiment Mode 1

Figure 1B:
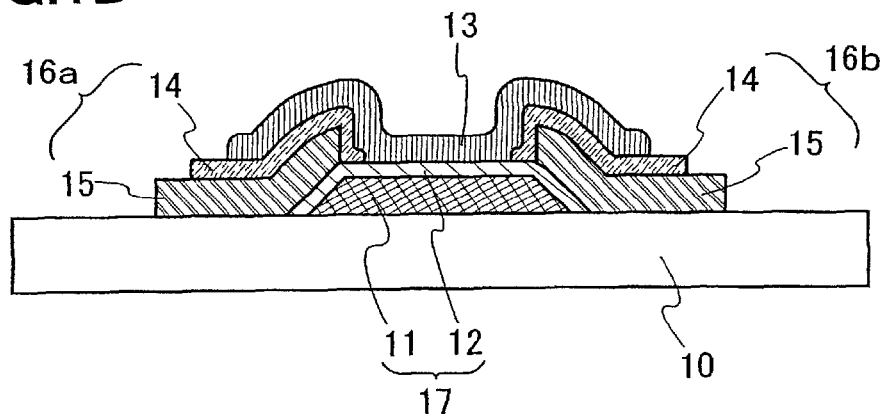

A configuration of an organic transistor structure of the present invention is shown in FIGS. 1A and 1B. Note that reference numeral 10 is a substrate, 11 is a gate electrode, 12 is a gate insulating film, 13 is a semiconductor layer including an organic semiconductor material, 14 is a composite layer having an organic compound and a metal oxide, 15 is a conductive layer, and source and drain electrodes 16a and 16b have a composite layer 14 and a conductive layer 15. Arrangement of each layer and electrode can be selected suitably depending of the use of the element. In addition, the composite layer 14 is formed to be in contact with the semiconductor layer 13 in FIGS. 1A and 1B; however, without being limited to this, the composite layer may be included in a portion of a source electrode and/or a drain electrode.

A structure of FIG. 1A is explained along manufacturing methods of FIGS. 2A to 2E. As the substrate 10, an insulating property substrate such as a glass substrate, a quartz substrate, a crystalline glass, a ceramic substrate, a stainless steel substrate, a plastic substrate (polyimide, acryl, polyethylene terephthalate, polycarbonate, polyarylate, polyethersulfone or the like) or the like can be used. In addition, these substrates may be used after polishing by CMP or the like as necessary.

Figure 2A:
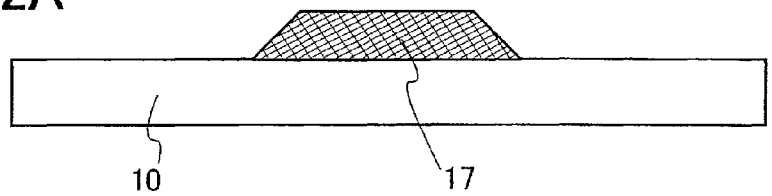
FIGS. 2A to 2E are diagrams explaining a manufacturing method of an organic transistor of the present invention.

A conductive layer 17 which becomes a gate electrode is formed over the substrate 10 (see FIG. 2A). A metal having an insulating property by nitriding and/or oxygenating may be used as the material of a conductive layer 17. Specifically, tantalum, niobium, aluminum, molybdenum, copper, or titanium is preferred. In addition, tungsten, chromium, nickel, cobalt, magnesium and the like can be given. A manufacturing method of the conductive layer 17 is not particularly limited, and after forming a film by a sputtering method or an evaporation method or the like, the film may be manufactured to have a desirable shape by an etching method or the like. In addition, the film may be formed by using a droplet including a conductive substance by an ink-jet printing method or the like.

Figure 2B:
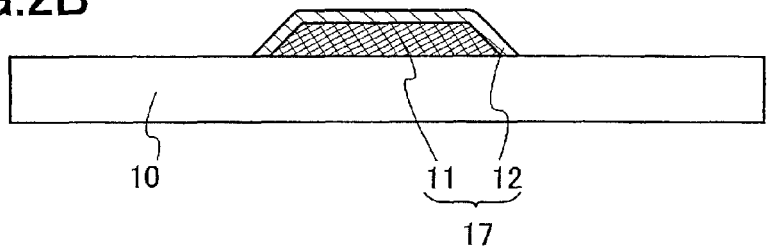

Next, the gate insulating film 12 including a nitride, an oxide, or an oxynitride of the metal is formed by nitriding and/or oxygenating the conductive layer 17 using dense plasma (see FIG. 2B). Dense plasma is produced by using a micro wave of high frequency, for example, using 2.45 GHz. Such dense plasma is used, and oxygen (or a gas including oxygen), nitrogen (or a gas including nitrogen) or the like is activated by plasma activation, and these are reacted with a material of the gate electrode directly to insulate the conductive layer 17.

Dense plasma of which density of electron is $10^{11}$ cm$^{-3}$ or more, and electron temperature is a range of 0.2 eV to 2.0 eV (more preferably, a range of 0.5 eV to 1.5 eV) is used. Such dense plasma which is characterized low electron temperature can form a film which is less damaged by plasma and has almost no defects than conventional plasma treatment since energy of motion of active species is low. In addition, this insulating film is denser than an insulating film which is formed by using an anodic oxidation method. The conductive layer 17 can perform as the gate electrode 11 except for the gate insulating film 12 insulated by using dense plasma of the conductive layer 17.

Figure 6:
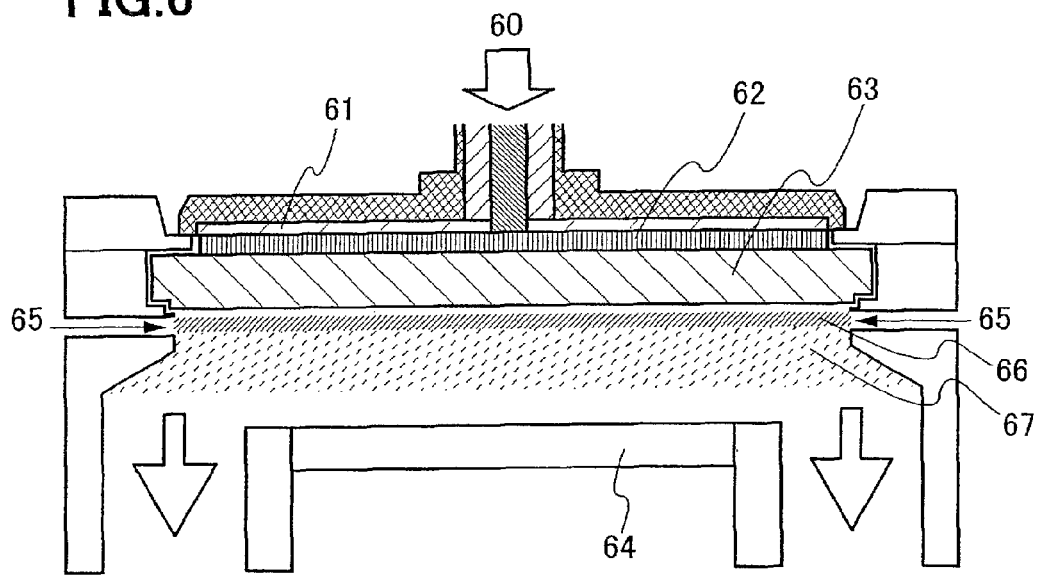
FIG. 6 is a schematic view of a dense plasma treatment device.

For example, dense plasma treatment is performed using a device of FIG. 6. Reference numeral 61 is a dielectric waveguide, 62 is a slot antenna having plural slots, 63 is a dielectric substrate which is made of quartz or aluminum oxide, and 64 is a stage for installing a substrate. The stage 64 has a heater. A micro wave is transmitted from 60, and a gas which is supplied from a gas supply port 65 in a plasma generating region 66 is activated. A position and a length of the slot in the slot antenna 62 are selected suitably depending on a wave length of the micro wave transmitted from 60.

By using such a device, plasma with uniformity, highly density, and low electron temperature can be activated, and low temperature treatment (substrate temperature 400° C. or less) can be achieved. Note, that plastics, which are thought to have low heat resistance generally, can be used as a substrate.

Note that gas in which oxygen (or gas including oxygen) or nitrogen (or gas including nitrogen) is mixed into an inert gas such as argon, krypton, helium, or xenon is used as a gas to be supplied. Therefore, these inert elements are mixed into the gate insulating film formed by dense plasma oxidation or nitriding treatment. Hydrogen may be included in a gas to be supplied.

Further, an activated gas which is more uniform can be supplied to a processing object by providing a shower plate in a device inside 67. In description below, dense plasma treatment in manufacturing of the gate insulating film is performed by using plasma having the above characteristics.

Figure 2C:
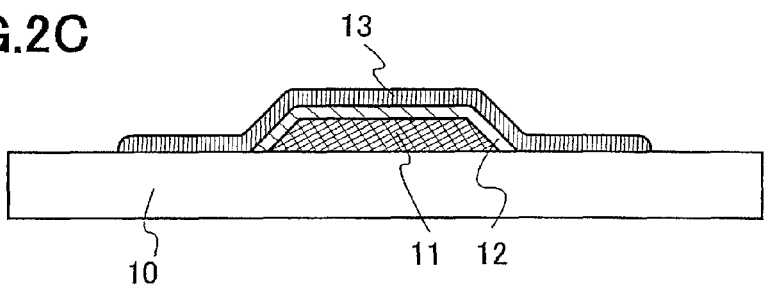

Next, a semiconductor layer 13 covering a gate insulating film 12 is formed (see FIG. 2C). The organic semiconductor material forming the semiconductor layer 13 has a carrier transporting property, and if the organic material can have modulation of carrier density by electric field-effect, low molecular and high molecular materials can be used, and the kind is not limited particularly. A polycyclic aromatic compound, a conjugate double bond compound, a metallophthalocyanine complex, a charge transfer complex, a condensed ring tetracarboxylic diimide type, an oligothiophene type, a fullerene type, a carbon nanotube or the like can be given. For example, polypyrrole, polythiophene, poly(3-alkylthiophene), polythienylenevinylene, poly(p-phenylenevinylene), polyaniline, polyazulene, polypyrene, polycarbazole, polyselenophene, polyfuran, poly (p-phenylene), polyindole, polypyridazine, naphthacene, hexacene, heptacene, pyrene, chrysene, perylene, coronene, terrylene, ovalene, quaterrylene, triphenodioxazine, triphenodiriazine, hexacene-6,15-quinone, polyvinylcarbazole, polyphenylenesulfide, polyvinylenesulfide, polyvinylpyridine, naphthalenetetracarboxylic diimide, anthracenetetracarboxylic diimide, C60, C70, C76, C78, C84, and derivatives thereof can be used. In addition, as concrete examples thereof, there is tetracene, pentacene, sexithiophene (6T), copper phthalocyanine, bis-(1,2,5-thiadiazolo)-p-quinobis(1,3-dithiol), rubrene, poly (2,5-thienylenevinylene) (PTV), poly (3-hexylthiophene-2,5-diyl) (P3HT), or poly (9,9'-dioctylfluorene-co-bithiophene) (F8T2) which is generally categorized in a P-type semiconductor, and 7,7,8,8,-tetracyanoquinodimethane (TCNQ), 3,4,9,10-perylenetetracarboxylicdianhydride (PTCDA), 1,4,5,8-naphthalenetetracarboxylicdianhydride (NTCDA), 11,11,12,12,-tetracyano-1,4-naphthaquinodimethane (TCNNQ), N,N'-dioctyl-3,4,9,10-perylenetetracarboxylicdiimide (PTCDI-C8H), copper16phthalocyaninefluoride ($F_{16}CuPc$), or 3',4'-dibutyl-5,5''-bis(dicyanomethylene)-5,5''-dihydro-2,2':5', 2''-terthiophen) (DCMT), or the like which is generally categorized in an N-type semiconductor. Note that in the organic semiconductor, the property of the P-type of the N-type is not an inherent property, and is relied in relation with an electrode injecting carriers, or intensity of electrical field when carrier injection is performed. There is a tendency that it is easy to become the P-type or the N-type; however, the organic semiconductor can be used as a P-type semiconductor and an N-type semiconductor. In this embodiment mode, a P-type semiconductor is more preferred.

These organic semiconductor materials can be formed by a method such as an evaporation method, spin coating method, or a droplet discharging method.

Figure 2D:
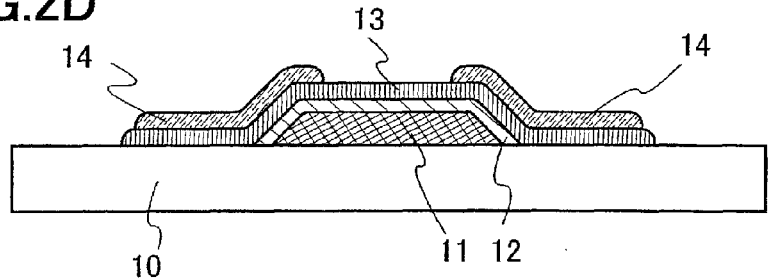

Next, a composite layer 14 is formed over the semiconductor layer 13 (see FIG. 2D). A kind of the organic compound used for the composite layer 14 of the present invention is not limited particularly, for example, 4,4'-bis[N-(1-naphtyl)-N-phenylamino]biphenyl (NPB), N,N'-diphenyl-N,N'-bis(3-methylphenyl)-1,1'-biphenyl-4,4'-diamine (TPD), 4,4-bis(N-{4-(N,N-di-m-tolylamino)phenyl}-N-phenylamino) biphenyl (DNTPD), 4,4',4''-tris[N-(3-methylphenyl)-N-phenylamino]triphenylamine (m-MTDATA), or 4,4',4''-tris[N-(1-naphthyl)-N-phenylamino]triphenylamine (1-TNATA) which has an aromatic amine skeleton is preferable. In addition, an N-arylcarbazole derivative such as N-(2-naphthyl)carbazole (NCz), 4,4'-di(N-carbazolyl)biphenyl (CBP), or anthracene, or an aromatic carbon hydride such as 9,10-diphenylanthracene (DPA) or the like can be used. In addition, a material which can be used as the semiconductor 13 can be used. In this case, adhesion and chemical stability of boundary face of the semiconductor layer 13 and the composite layer 14 are improved. Then, an advantage that a manufacturing process becomes easily can be given.

A metal oxide used for the composite layer 14 of the present invention is not limited particularly. An oxide of titanium, vanadium, chromium, zirconium, niobium, molybdenum, hafnium, tantalum, tungsten, or rhenium is preferable. The composite layer including a metal oxide at the range of 5 wt % to 80 wt %, preferably, the range of 10 wt % to 50 wt % is preferable.

The organic compound such as 7,7,8,8-tetracyanoquinodimethane (TCNQ), 2,3,5,6-tetrafluoro-7,7,8,8-tetracyanoquinodimethane ($F_4$-TCNQ) which represents an electron-accepting property may be used in substitution for a metal oxide.

The composite layer 14 may be formed by a co-evaporation using resistance heating, by a co-evaporation using resistance heating and an electron gun evaporation (EB evaporation), or by simultaneously by a sputtering method and resistance heating or the like. In addition, the film formation may be performed by using a wet method such as a sol-gel method.

Since the electric conductivity of the composite layer 14 is as high as about $10^{-5}$ [S/cm], and even when the film thickness is changed from several nm to several hundred nm, the change a value of resistance of a transistor is small, the film thickness of the composite layer can be controlled suitably from several nm to several hundred nm or more depending on an application or shape of an element which is formed.

Figure 2E:
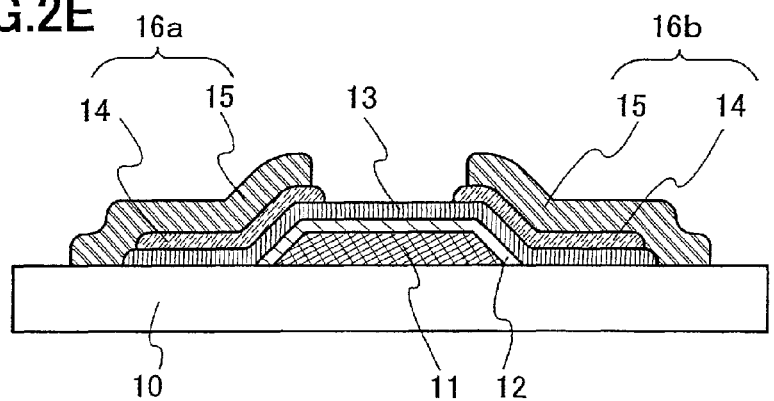

Next, a conductive layer 15 is formed (see FIG. 2E). A material used for the conductive layer 15 is not limited particularly. A metal such as gold, platinum, aluminum, tungsten, titanium, copper, molybdenum, tantalum, niobium, chromium, nickel, cobalt, magnesium, an alloy including them, and a conductive high molecular compound such as polyaniline, polypyrrole, polythiophen, polyacethylene, polydiacetylene can be given. Generally, a metal is used often for the conductive layer 15 to be used for source and drain electrodes 16a and 16b.

A forming method is not limited particularly as long as the semiconductor layer 13 does not decompose. After forming the film by a sputtering method or an evaporation method or the like, the conductive layer 15 may be processed in the desirable shape by an etching method or the like and manufactured. In addition, the conductive layer 15 may be formed by an ink-jet printing method using a droplet including a conductive substance or the like.

In the organic transistor manufactured according to the above method, an energy barrier between the semiconductor layer 13 and the source and drain electrodes 16a and 16b is reduced by using the source and drain electrodes 16a and 16b which have a structure in which the composite layer 14 is interposed between the semiconductor layer 13 and the conductive layer 15, and carrier injection from one of the electrode of the source and drain electrodes to the semiconductor layer and carrier discharging from the semiconductor layer to the other electrode become easily. Consequently, a material of the conductive layer 15 does not have to select the material in which the energy barrier with the semiconductor 13 is low, and can be selected without a constraint of a work function.

In addition, the composite layer 14 is superior in a carrier injection property and chemically stable, and adhesion with the semiconductor 13 is better than the conductive layer 15. The source and drain electrodes 16a and 16b of the present invention can be used also as a wiring.

Since the gate insulating film 12 formed by using dense plasma has few plasma damage and defects, a tunnel leakage current can be reduced. Since asperity of the surface is small, carrier mobility can be high. Further, it makes orientation of the organic semiconductor material which makes the semiconductor layer 13 formed over the gate insulating film easy. In addition, high dielectric constant gate insulating film can be formed by selecting a material such as Ta or Al to the gate electrode which becomes high dielectric constant by a nitriding treatment or an oxidation treatment. Therefore, even if the gate insulating film is made a thinner, an equivalent oxide film thickness (EOT: Equivalent Oxide Thickness) can be gained, and high speed operation can be performed while preventing a tunnel leakage current. Further, since a width of the gate electrode can be narrowed and the gate electrode can be made thinner by reacting the gate electrode directly, a channel-length can be shortened. Therefore, high integration is enabled.

An organic insulating material such as polyimide, polyamic acid, or polyvinylphenyl may be formed a film in contact with a under surface of the semiconductor layer 13. With such a structure, orientation of the organic semiconductor material is more improved, and adhesion of the gate insulating film 12 and the semiconductor layer 13 can be more improved.

In addition, a structure in which the source and drain electrodes 16a and 16b are provided over the semiconductor layer 13 like a structure of FIG. 1A (hereinafter referred to as a top contact type structure) is exemplified; however, in the present invention, a structure in which the source and drain electrodes are provided under the organic semiconductor layer like a structure of FIG. 1B (hereinafter referred to as a bottom contact structure) may be used.

In a case of the bottom gate type, when the top contact type structure is adopted, there is an advantage in which carrier mobility is high. Meanwhile, in a case of using the bottom contact type structure, a process such as photolithography can be used easily for microfabrication of the source and drain wirings. Therefore, the structure of the organic transistor may be selected in accordance with drawback and advantage.

As described above, the high reliable organic transistor can be provided.

Embodiment Mode 2

Figure 3A:
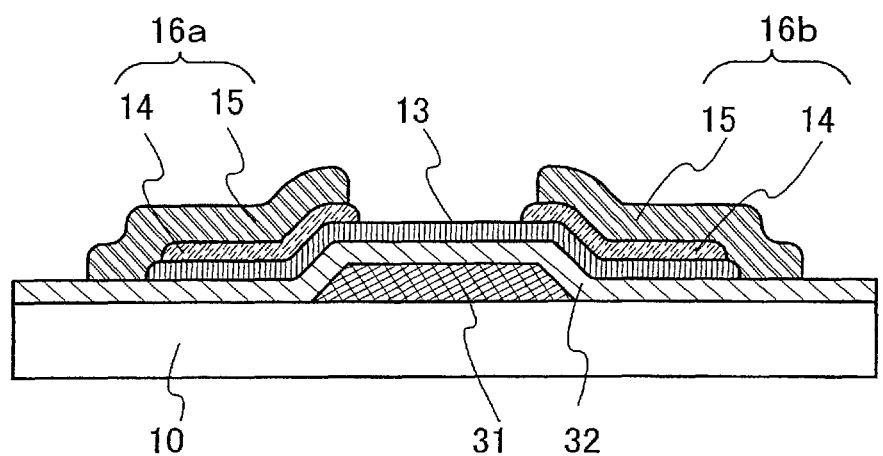
FIGS. 3A and 3B are diagrams explaining configurations of organic transistors of the present invention.
Figure 3B:
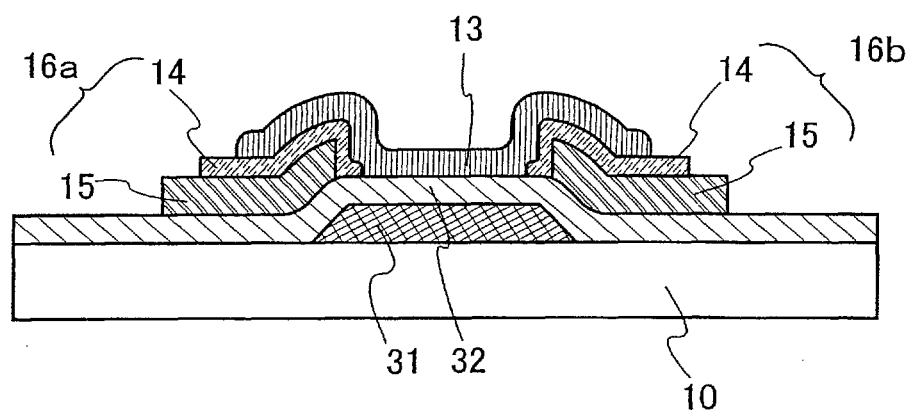

The organic transistor as shown in embodiment mode 1 uses the insulating film formed by performing dense plasma treatment to the conductive layer which becomes the gate electrode as the gate insulating film; however, in this embodiment mode, a gate insulating film is formed by nitriding or oxygenizing with dense plasma additionally to the insulating film formed previously like FIGS. 3A and 3B. Since, elements except the gate insulating film and the gate electrode are similar to those of Embodiment Mode 1, they are denoted by the same reference numerals and the description thereof is omitted.

A gate electrode 31 is formed over a substrate 10. A material using for the gate electrode 31 is not limited particularly. For example, a metal such as gold, platinum, aluminum, tungsten, titanium, copper, molybdenum, tantalum, niobium, chromium, nickel, cobalt, magnesium and an alloy including them, a conductive high molecular compound such as polyaniline, polypyrrole, polythiophene, polyacetylene, polydiacetylene, and polysilicon doped with an impurity can be given. A method for manufacturing the gate electrode 31 is not limited particularly, after forming by a sputtering method, an evaporation method or the like, it may be processed into a desired shape and manufactured by an etching method or the like. In addition, an ink-jetting method or the like may be used by using a droplet including a conducting substance.

Next, an insulating film 32 covering the gate electrode 31 is formed. An inorganic material such as silicon oxide, silicon nitride or silicon oxynitride is used for the insulating film 32. These insulating films 32 can be formed by an application method such as a dipping method, a spin coating method, a droplet discharging method, and a CVD method, a sputtering method.

The gate insulating film is formed by performing nitriding treatment or oxidation treatment using dense plasma to this insulating film 32. For example, silicon oxynitride is formed by performing dense plasma nitriding treatment to the insulating film 32 of silicon oxide, or performing dense plasma oxidation treatment to the insulating film 32 of silicon nitride. In addition, the gate insulating film which has a stacked structure of silicon oxide or silicon nitride and silicon oxynitride may be formed. The number of the gate insulating films to be stacked is not limited especially. A silicon nitride film including highly concentration nitrogen can be obtained by performing dense plasma nitriding to silicon nitride.

Dense plasma is produced by using high frequency micro wave e.g, 2.45 GHz. Activation oxygen (or gas including oxygen) or nitrogen (or gas including nitrogen) is activated by plasma activation by using such dense plasma, and is reacted with the insulating film. Since energy of motion of active species is low, dense plasma in which low electron temperature is characteristic can form few plasma damage and less-defective film compared with conventional plasma treatment. Note that an inert gas used for a gas to be supplied which is shown in Embodiment Mode 1 is mixed.

A semiconductor layer 13 is formed over the gate insulating film. Next, the source and drain electrodes 16a and 16b are formed.

In the organic transistor having such a structure, an energy barrier between the semiconductor layer 13 and the source and drain electrodes 16a and 16b is reduced by using the source and drain electrodes 16a and 16b which have a structure in which the composite layer 14 is interposed between the semiconductor layer 13 and the conductive layer 15, and carrier injection from one of the electrode of the source and drain electrodes to the semiconductor layer and carrier discharging from the semiconductor layer to the other electrode become easily. Consequently, a material of the conductive layer 15 does not have to select the material in which the energy barrier with the semiconductor 13 is low, and can be selected without a constraint of a work function.

In addition, the composite layer 14 is superior in a carrier injection property and chemically stable, and adhesion with the semiconductor 13 is better than the conductive layer 15. The source and drain electrodes 16a and 16b of the present invention can be used also as a wiring.

Since the gate insulating film formed by using dense plasma is few plasma damage and defects, a tunnel leakage current can be reduced. Since asperity of the surface is small, carrier mobility can be high. Further, it makes orientation of the organic semiconductor material which makes the semiconductor layer 13 formed over the gate insulating film easy.

The top contact type structure like FIG. 3A is exemplified; however, in the present invention, the bottom contact type structure like FIG. 3B may be used.

In a case of the bottom gate type, when the top contact type structure is adopted, there is an advantage in which carrier mobility is higher. Meanwhile, in a case of using the bottom contact type structure, a process such as photolithography can be used easily for providing microfabrication of the source and drain electrode wirings. Therefore, the structure of the organic transistor may be selected in accordance with drawback and advantage.

In addition, the conductive layer which becomes the gate electrode is insulated by using dense plasma like embodiment mode 1, and the obtained insulating film may be used as a portion of the gate insulating film. Note that a material of the gate electrode which can be used at that time is the material of the conductive layer 17 denoted in embodiment mode 1. In this case, since a width of the gate electrode can be narrowed and the gate electrode can be made thinner by reacting the gate electrode directly, a channel-length can be shortened. Therefore, high integration is enabled.

As described above, the high reliable organic transistor can be provided.

Embodiment Mode 3

Figure 4A:
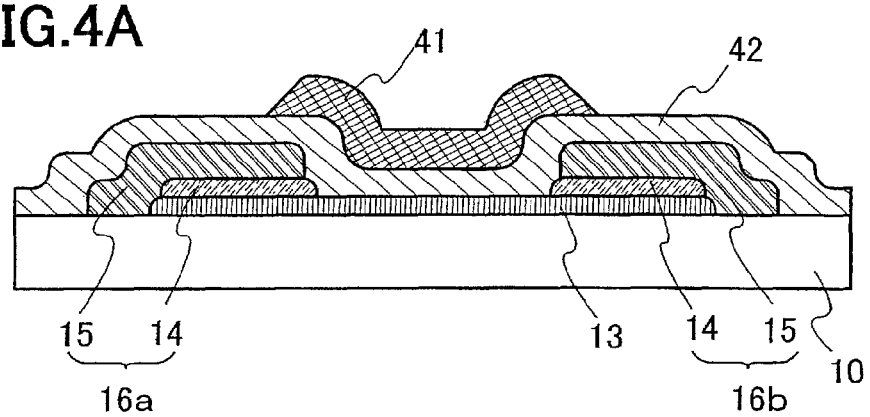
FIGS. 4A and 4B are diagrams explaining configurations of organic transistors of the present invention.
Figure 4B:
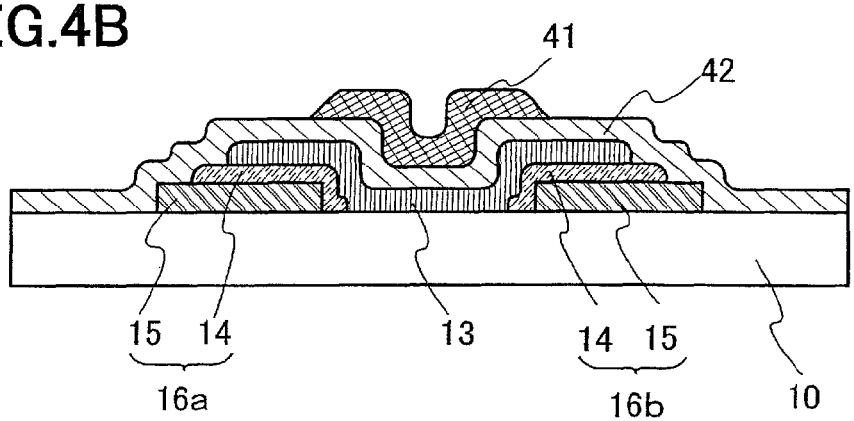

In this embodiment mode, an organic transistor having a structure which is different from the structure denoted in Embodiment Modes 1 and 2 is explained using FIGS. 4A and 4B. The organic transistor of the embodiment modes 1 and 2 is the bottom gate type transistor; however, the transistor of this embodiment mode is a top gate type transistor. Portions similar to those of Embodiment Mode 1 are denoted by the common reference numerals and the description thereof is omitted.

A structure of FIG. 4A is explained. The semiconductor layer 13 is formed over the substrate 10. Further, the source and drain electrodes 16a and 16b having the composite layer 14 and the conductive layer 15 are formed over the semiconductor layer 13.

Next, an insulating film 42 covering the semiconductor layer 13 and the source and drain electrodes 16a and 16b is formed. An inorganic material such as silicon oxide, silicon nitride or silicon oxynitride is used for the insulating film 42. These insulating films 32 can be formed by an application method such as a dipping method, a spin coating method, a droplet discharging method, and a CVD method, a sputtering method. Note that it is necessary to use such a condition or a method that the semiconductor layer 13 is not broken.

The gate insulating film is formed by performing nitriding treatment or oxidation treatment using dense plasma to this insulating film. For example, silicon oxynitride is formed by performing dense plasma nitriding treatment to the insulating film 42 of silicon oxide, or performing dense plasma oxidation treatment to the insulating film 42 of silicon nitride. In addition, the gate insulating film which has a stacked structure of silicon oxide or silicon nitride and silicon oxynitride may be formed. The number of the gate insulating film to be stacked is not limited especially. A silicon nitride film including highly concentration nitrogen can be obtained by performing dense plasma nitriding to silicon nitride.

Dense plasma is produced by using high frequency micro wave e.g, 2.45 GHz. Activation oxygen (or gas including oxygen) or nitrogen (or gas including nitrogen) is activated by plasma activated by using such high dense plasma, and is reacted with the insulating film. Since energy of motion of active species is low, dense plasma in which low electron temperature is characteristic can form little plasma damage and less-defective film compared with conventional plasma treatment. Note that an inert gas used for a gas to be supplied which is shown in Embodiment Mode 1 is mixed.

Next, a gate electrode 41 is formed. A material using for the gate electrode 41 is not limited particularly. For example, a metal such as gold, platinum, aluminum, tungsten, titanium, copper, molybdenum, tantalum, niobium, chromium, nickel, cobalt, magnesium and an alloy including them, a conductive high molecular compound such as polyaniline, polypyrrole, polythiophene, polyacetylene, polydiacetylene, and polysilicon doped with an impurity can be given. A method for manufacturing the gate electrode 41 is not limited particularly, after forming by a sputtering method, an evaporation method or the like, it may be processed into a desired shape by an etching method or the like. In addition, an ink-jetting method or the like may be used by using a droplet including a conducting substance. Note that it is necessary to use such a condition or a method that the semiconductor layer is not broken.

In the oaganic transistor having such a structure, an energy barrier between the semiconductor layer 13 and the source and drain electrodes 16a and 16b is reduced by using the source and drain electrodes 16a and 16b which have a structure in which the composite layer 14 is interposed between the semiconductor layer 13 and the conductive layer 15, and carrier injection from one of the electrode of the source and drain electrodes to the semiconductor layer and carrier discharging from the semiconductor layer to the other electrode become easily. Consequently, a material of the conductive layer 15 does not have to select the material in which the energy barrier with the semiconductor 13 is low, and can be selected without a constraint of a work function.

In addition, the composite layer 14 is superior in a carrier injection property and chemically stable, and adhesion with the semiconductor 13 is better than the conductive layer 15. The source and drain electrodes 16a and 16b of the present invention can be used also as a wiring.

Since the gate insulating film formed by using dense plasma is few plasma damage and defects, a tunnel leakage current can be reduced.

The top contact type structure like FIG. 4A is exemplified; however, in the present invention, the bottom contact type structure like FIG. 4B may be used.

Furthermore, the heat resistance can be improved by performing nitriding treatment to the gate electrode by using dense plasma. In the case of insulating the conductive layer which becomes the gate electrode, since a width of the gate electrode can be narrowed and the gate electrode can be made thinner, a channel-length can be shortened. Therefore, high integration is enabled.

As described above, the high reliable organic transistor can be provided.

Embodiment Mode 4

Figure 5A:
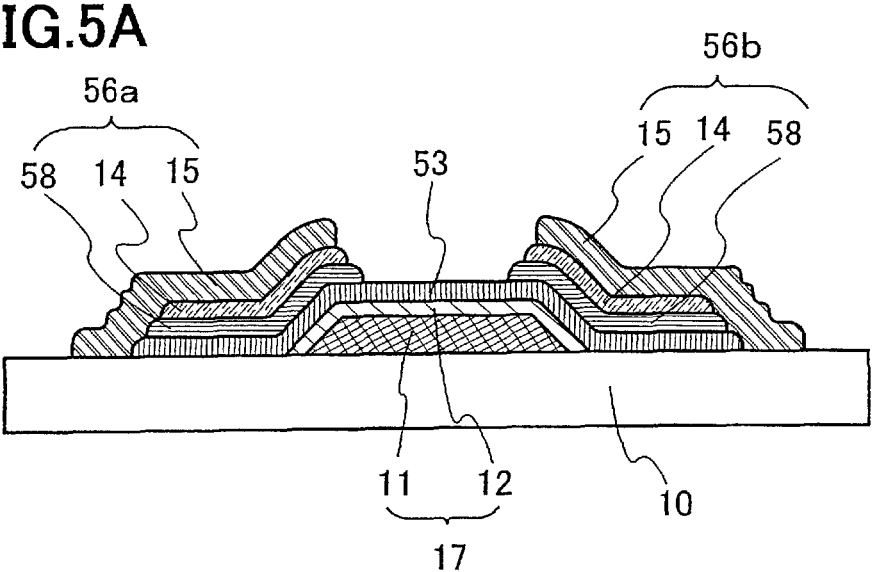
FIGS. 5A and 5B are diagrams explaining configurations of organic transistors of the present invention.
Figure 5B:
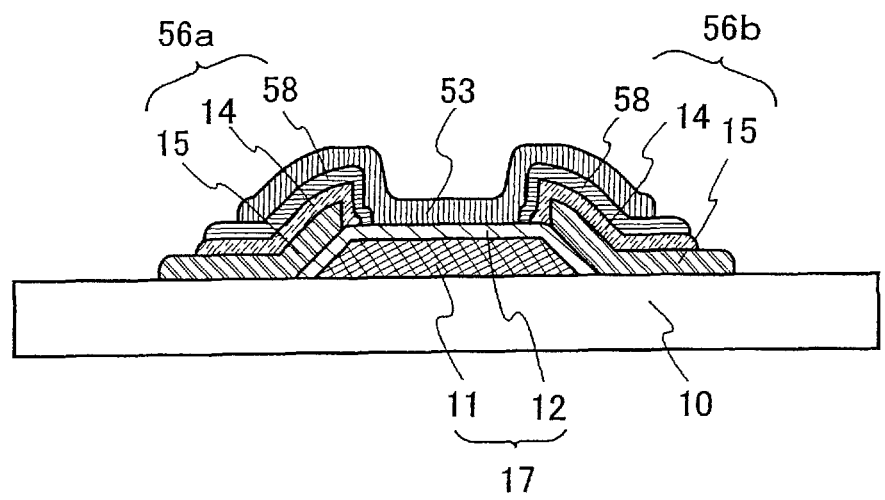

In this embodiment mode, an example of a structure of an N-type organic transistor in which electrons serve as carriers is explained using FIGS. 5A and 5B. The source and drain electrodes 16a and 16b in the embodiment mode 1 have a second composite layer 58 including alkali metal, alkaline-earth metal, or a compound including them (an oxide, a nitride, or salt) additionally. In this embodiment mode, the composite layer 14 having the organic oxide and the metal oxide of Embodiment Mode 1 is referred to as a first composite layer 14. Elements similar to those of Embodiment Mode 1 are denoted by the same reference numerals, and the description is omitted.

The semiconductor material which is written in Embodiment Mode 1 can be used as the organic semiconductor material used for a semiconductor layer 53. In particular, a material which is cited as an N-type semiconductor is preferable.

The type of alkali metal, alkaline-earth metal, or a compound including them (an oxide, a nitride, or salt) is not limited particularly. However, lithium, sodium, potassium, cesium, magnesium, calcium, strontium, barium, lithium oxide, magnesium nitride, or calcium nitride which is to be given below is preferable. Note that a method for manufacturing the second composite layer 58 is not limited, as long as the semiconductor layer 53 does not resolved, and a sputtering method or an evaporation method can be used.

In addition, the second composite layer 58 may be formed by a mixed material of these materials and the organic compound having an electron transport property. As the organic material having an electron transport property, there is perylene tetra carboxylic anhydride and the derivative thereof, a perylene tetra carboxylic diimide derivative, naphthalene tetra carboxylic anhydride and the derivative, a naphthalene tetra carboxylic diimide derivative, a metallophthalocyanine derivative, or fullerene series. Additionally, for example, the material which is composed of metallic complex having a quinoline skeleton or a benzoquinoline skeleton such as tris(8-quinolinolato)aluminum (abbreviated to ANA tris(4-methyl-8-quinolinolato)aluminum (abbreviated to Almq$_3$), bis(10-hydroxybenz)[h]-quinolinato)-beryllium (abbreviated to BeBq$_2$), bis (2-methyl-8-quinolinolato)-4-phenylphenolato-aluminum (abbreviated to BAlq) can be used. In addition, a metal complex having an oxazole or thiazole ligand such as bis[2-(2-hydroxyphenyl)benzooxazolato]zinc (abbreviated to Zn(BOX)$_2$), bis[2-(2-hydroxyphenyl)benzothiazolato]zinc (abbreviated to Zn(BTZ)$_2$) can be used. In addition to such metal complex, 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl] benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), or the like can be used. Note that the second composite layer 58 in which the organic compound having an electron transporting property is mixed may be formed by a co-evaporation method using resistance heating; a co-evaporation method using resistance heating and an electron gun evaporation (EB evaporation); simultaneous deposition using sputtering and resistance heating, or the like.

First, the conductive layer 17 which becomes a gate electrode is formed over a substrate 10. Next, a gate insulating film 12 which made of the nitride, oxide, or oxynitride of the gate electrode material is formed by nitriding or oxygenizing the conductive layer 17 which becomes the gate electrode by using dense plasma. Furthermore, the source and drain electrodes 56a and 56b having the second composite layer 58, the first composite layer 14, and the conductive layer 15 are formed, thus the organic transistor is manufactured. An inert gas used for a gas to be supplied such as argon, krypton, helium, or xenon as shown in Embodiment Mode 1 is mixed in the gate insulating film 12.

In the organic transistor manufactured by the above method, when a voltage is applied to an electrode having a structure in which the second composite layer 58, the first composite layer 14, and the conductive layer 15 are stacked, holes and electrons are generated by carrier separating in vicinity of the boundary face of the second composite layer 58 and the first composite layer 14. The electrons of the generated carriers are supplied to the semiconductor layer 53 from the second composite layer 58, and the holes of the generated carriers flow to the conductive layer 15. In this manner, a current in which the electron is carrier flows into the semiconductor layer 53.

In addition, an energy barrier between the semiconductor layer 53 and the source and drain electrodes 56a and 56b is reduced by using the source and drain electrodes 56a and 56b which have a structure in which the composite layer 14 is interposed between the semiconductor layer 53 and the conductive layer 15, and carrier injection from one of the electrode of the source and drain electrodes to the semiconductor layer and carrier discharging from the semiconductor layer to the other electrode become easily. Consequently, a material of the conductive layer 15 does not have to select the material in which the energy barrier is low, and can be selected without a constraint of a work function.

In addition, the first composite layer 14 is superior in a carrier injection property and chemically stable and adhesion with the semiconductor 53 is better than the conductive layer 15. The source and drain electrodes 56a and 56b of the present invention can be used also as a wiring.

Since the gate insulating film formed by using dense plasma is few plasma damage and defects, a tunnel leakage current can be reduced. Since asperity of the surface is small, carrier mobility can be high. Further, it makes orientation of the organic semiconductor material which makes the semiconductor layer 53 formed over the gate insulating film easy. In addition, high dielectric constant gate insulating film can be formed by selecting a material such as Ta or Al to the gate electrode which becomes high dielectric constant by a nitriding treatment or an oxidation treatment. Therefore, even if the gate insulating film is made a thinner, a physical film thickness can be gained, and high speed operation can be performed while preventing a tunnel leakage current. Further, since a width of the gate electrode can be narrowed and the gate electrode can be made thinner by reacting the gate electrode directly, a channel-length can be shortened. Therefore, high integration is enabled.

An organic insulating material such as polyimide, polyamic acid, or polyvinylphenyl may be formed a film in contact with a under surface of the semiconductor layer 53. With such a structure, orientation of the organic semiconductor material is more improved, and adhesion of the gate insulating film 12 and the semiconductor layer 53 can be more improved.

As described above, the high reliable organic transistor can be provided.

Embodiment Mode 5

Figure 7:
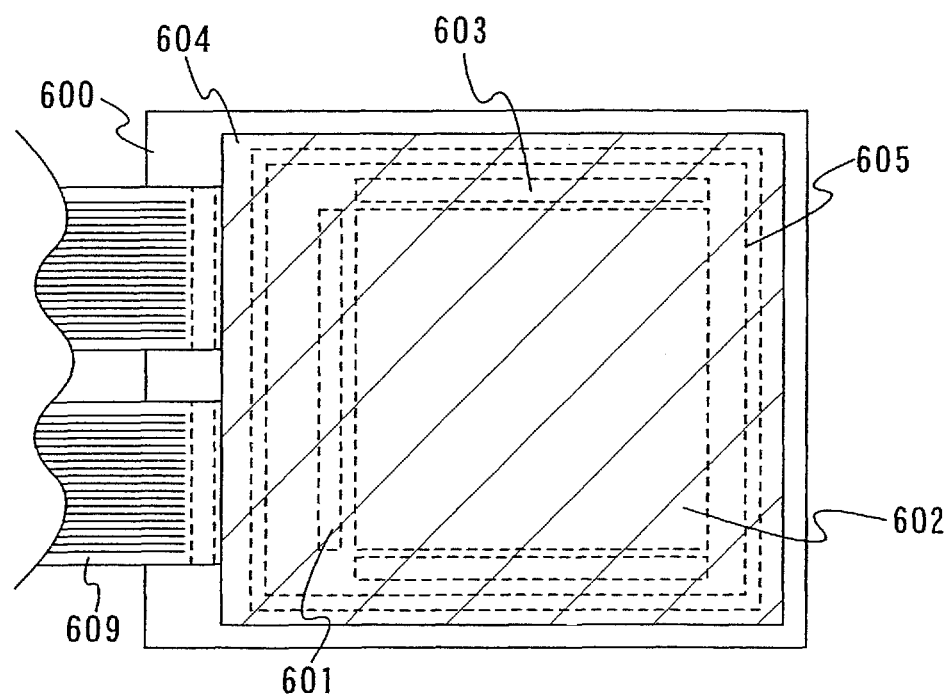
FIG. 7 is a top view of a liquid crystal display device using the present invention.

A mode of a liquid crystal display device (liquid crystal device) including an organic transistor of the present invention is explained using FIG. 7.

FIG. 7 is a schematic top view showing a liquid crystal display device. Reference numeral 601, which is indicated by a dotted line, is a driver circuit portion (a source side driver circuit), 602 is a pixel portion, 603 is a driver circuit portion (a gate side driver circuit), and these are sealed by an element substrate 600, a counter substrate 604, and a sealant 605.

The source side driver circuit 601 and the gate side driver circuit 603 receive a video signal, a clock signal, a start signal, a reset signal and the like from an FPC (flexible printed circuit) 609 serving as an external input terminal. Though the only FPC is illustrated here, a printed wiring board (PWB) may be mounted on the FPC. The liquid crystal display device in the present invention includes not only the liquid crystal display device itself but also a state where an FPC or a PWB is mounted thereto.

Figure 8:
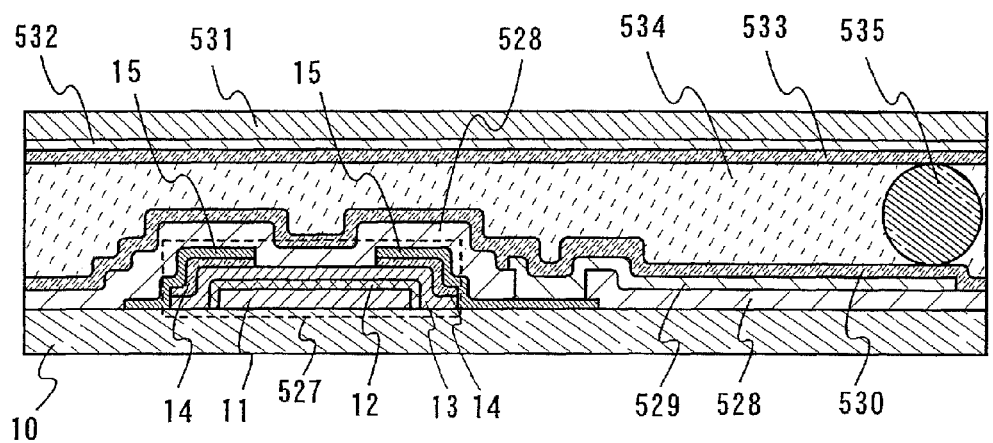
FIG. 8 is a cross-sectional view of a liquid crystal display device using the present invention.

The pixel portion 602 is not limited especially, for example, the pixel portion 602 has a liquid crystal display element (liquid crystal element) and a transistor for driving the liquid crystal display element as shown in a sectional-view of FIG. 8.

The liquid crystal display device shown in the sectional-view of FIG. 8 has an organic transistor 527 having the gate insulating film 12 formed by insulating the conductive layer which becomes the gate electrode by dense plasma treatment same as the organic transistor written in Embodiment Mode 1. Portions similar to those of Embodiment Mode 1 are denoted by the same reference numerals and the description thereof is omitted.

The organic transistor 527 formed over the substrate 10 is covered with an insulating film 528. One side of the conductive layer 15 which functions as a portion of the source and drain electrodes is electrically connected to a pixel electrode 529 through a contact hole. The liquid crystal display element is formed by sandwiching a liquid crystal layer 534 between a counter electrode 532 formed over a counter substrate 531 and the pixel electrode 529. Orientation films 533 and 530 are formed respectively on the surfaces of the counter electrode 532 which is contact with the liquid crystal layer 534 and the pixel electrode 529. Note that the liquid crystal layer 534 keeps cell gap by a spacer 535. The structure of the liquid crystal display device is not limited particularly.

Figure 9:
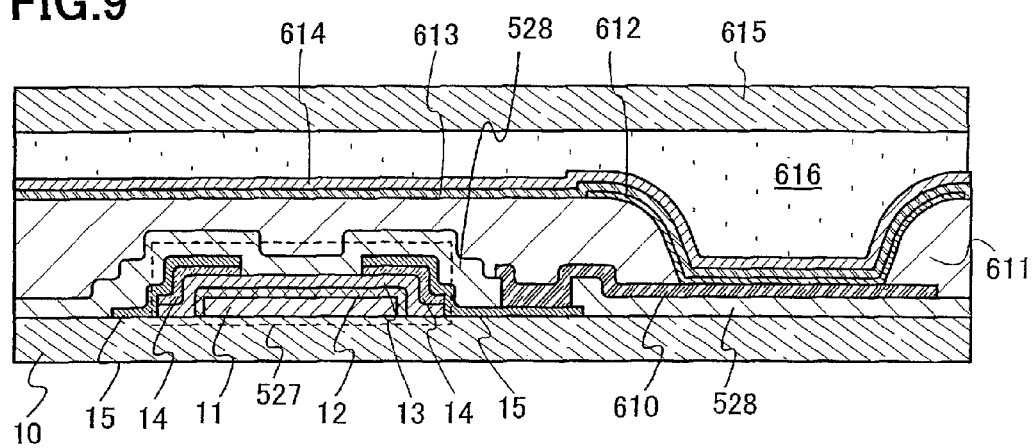
FIG. 9 is a cross-sectional view of a light-emission display device using the present invention.

A light emitting device using the organic transistor 527 of the present invention is explained with reference to FIG. 9. The light emitting device shown in a sectional-view of FIG. 9 has an organic transistor 527 having the gate insulating film 12 formed by insulating the conductive layer which becomes the gate electrode by the dense plasma treatment, similarly to the organic transistor written in Embodiment Mode 1. Portions similar to those of Embodiment Mode 1 are denoted by the same reference numerals and the description thereof is omitted.

The organic transistor 527 formed over the substrate 10 is covered with the insulating layer 528. One side of the conductive layer 15 which functions as a portion of the source and drain electrodes is electrically connected to a first electrode 610 through a contact hole. An end portion of the first electrode 610 is covered with an insulating layer 611, and a light emitting layer 612 is formed so as to cover a portion exposing from the insulating layer 611. A second electrode 613 and a passivation film 614 are formed over the light emitting layer 612. Note that the light emitting layer 612 is isolated from outside air by sealing the substrate 10 and a counter substrate 615 by using the sealant (not illustrated) in the outside of the pixel portion. An interspace 616 between the counter substrate 615 and the substrate 10 may be filled with an inert gas such as dried nitrogen, or the sealing may be performed by filling the interspace 616 with resin instead of the sealant. The structure of the light emitting device is not limited particularly.

When the gate insulating film formed by using dense plasma is used as the organic transistor 527, the tunnel leakage current can be reduced and a high reliable display device can be obtained.

In this embodiment mode, the insulating film formed by performing dense plasma treatment to the conductive layer which becomes the gate electrode can be used as the gate insulating film using for the organic transistor 527. However, the gate insulating film processed by dense plasma treatment may be used.

Figure 10A:
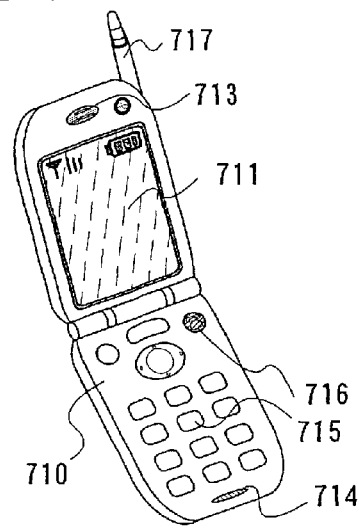
FIGS. 10A to 10D are diagrams of electronics devices using the present invention.
Figure 10B:
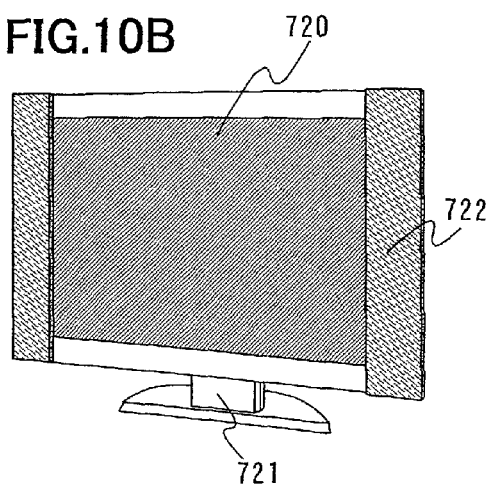
Figure 10C:
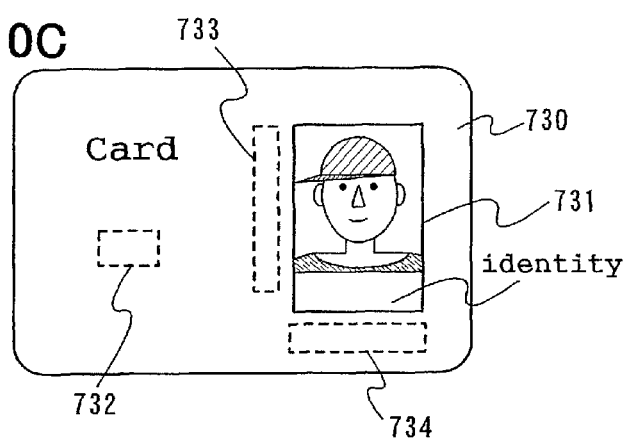
Figure 10D:
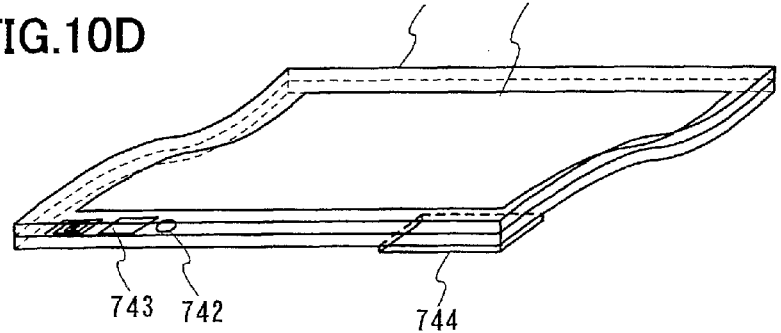

The display device as described above can be used as a display device mounted to an electronics device such as a telephone set or a television set as shown in FIGS. 10A and 10B. In addition, the display device may be mounted to a card having a function of managing private information such as an ID card as shown in FIG. 10C, to a flexible electronic paper as shown in FIG. 10D, or the like.

FIG. 10A is a diagram of a telephone set, and a main body 710 of the telephone set includes a display portion 711, an audio output portion 713, an audio input portion 714, operation switches 715 and 716, an antenna 717, and the like.

An active matrix type display device is provided in the display portion 711. A display system is may be a liquid crystal display or EL display. The display portion 711 has an organic transistor in every pixel. The gate insulating film processed by dense plasma treatment by using the above embodiment mode is used to the organic transistor. In addition, an integrated circuit for driving the display portion 711 is formed over the substrate same as the organic transistor or mounted. The organic transistor having the gate insulating film processed by dense plasma treatment by using the above embodiment mode may be used for the transistor provided in the integrated circuit. A telephone set having a good electrical property and high reliability can be obtained by using the organic transistor of the present invention.

FIG. 10B shows a television set manufactured by applying the present invention. The television set includes a display portion 720, a housing 721, a speaker 722, and the like.

An active matrix type display device is provided in the display portion 720. A display system is may be a liquid crystal display or EL display. The display portion 720 has an organic transistor in every pixel. The gate insulating film processed by dense plasma treatment by using the above embodiment mode is used to the organic transistor. In addition, an integrated circuit for driving the display portion 720 is formed over the substrate same as the organic transistor or mounted. The organic transistor having the gate insulating film processed by dense plasma treatment by using the above embodiment mode may be used to the transistor provided in the integrated circuit. A television set having a good electrical property and high reliability can be obtained by using the organic transistor of the present invention.

FIG. 10C shows an ID card manufactured by applying the present invention. The ID card includes a support medium 730, a display portion 731, an integrated circuit chip 732 incorporated in the support medium 730 or the like. Integrated circuits 733 and 734 for driving the display portion 731 are incorporated into the support medium 730.

An active matrix type display device is provided in the display portion 731. A display system is may be a liquid crystal display or EL display. The display portion 731 has an organic transistor in every pixel. The gate insulating film processed by dense plasma treatment by using the above embodiment mode is used to the organic transistor. In addition, integrated circuits 733 and 734 for driving the display portion 731 are formed over the substrate same as the organic transistor or mounted. The organic transistor having the gate insulating film processed by dense plasma treatment by using the above embodiment mode may be used for the transistor provided in the integrated circuits 733 and 734. An ID card having a good electrical property and high reliability can be obtained by using the organic transistor of the present invention.

The type of information input or output can be confirmed by displaying the information input or output by an integrated circuit chip 732, in the display portion 731.

FIG. 10D shows an electronic paper manufactured by applying the present invention. A main body 740 includes a display portion 741, a receiving apparatus 742, a driving circuit 743, a film battery 744, or the like.

An active matrix type display device is provided in the display portion 741. A display method is may be a liquid crystal display or EL display. The display portion 741 has an organic transistor in every pixel. The gate insulating film processed by dense plasma treatment by using the above embodiment mode is used to the organic transistor. In addition, a driving circuit 743 for driving a receiving apparatus 742 and the display portion 741 is formed over the substrate same as the organic transistor or mounted. The organic transistor having the gate insulating film processed by dense plasma treatment by using the above embodiment mode may be used for the transistor provided in the receiving apparatus 742 and the driving circuit 743. In an information processing function, a loading of the display device can be reduced by using another device having the receiving apparatus 742 and a communication function. Since the organic transistor of the present invention can be manufactured on a flexible substrate such as a plastic substrate, it is very effective to apply the organic transistor of the present invention to an electronic paper, and the electronic paper having a good electrical property and high reliability can be manufactured.

As set forth above, the application range of the invention is so wide that it can be applied to display devices in various fields. This embodiment mode can be freely combined with the structure of the Embodiment Modes 1 to 4.

Embodiment 1

The organic transistor manufactured by using the present invention is explained using FIGS. 1A and 1B.

A conductive layer 17 which has a 100 nm film thickness and made of aluminum is formed over the substrate 10 by a sputtering method. Next, a gate insulating film 12 which has a 30 nm film thickness is formed by performing dense plasma oxygenizing to the conductive layer 17. When the dense plasma treatment device in FIG. 6 is used, an interval from a plasma source to the substrate which is a processing object may be set in a range of 20 mm to 80 mm; however, a range of 20 mm to 60 mm is preferable. Except for the gate insulating film 12 of the conductive layer 17 insulated by using dense plasma functions as the gate electrode 11.

Next, the semiconductor layer 13 is formed over the gate insulating film 12 by forming a 50 nm thick pentacene as a film so as to cover an overlapping portion of the gate insulating film 12 and the gate electrode 11.

A molybdenum oxide (VI) and TPD which is an aromatic amine compound are formed as a film with a 10 nm film thickness so that molar ratio is 1:1 by the co-evaporation method as the composite layer 14. Furthermore, aluminum is formed by a vacuum evaporation using a mask as the conductive layer 15, and the source and drain electrodes 16a and 16b are manufactured.

According to the above, a high reliable P-channel organic transistor can be obtained.

The application is based on Japanese Patent Application serial No. 2005-125930 filed in Japan Patent Office on Apr. 25, 2005 the entire contents of which are hereby incorporated by reference.

What is claimed is:

1. A method for manufacturing an organic transistor, the method comprising the steps of:
    forming a first conductive layer over a substrate;
    performing plasma treatment on a surface of the first conductive layer to form a gate insulating film, wherein the plasma treatment is performed with density of electron of $10^{11}$ cm$^{-3}$ or more and an electron temperature in a range of 0.2 eV to 2.0 eV;
    forming a second conductive layer over and in contact with the gate insulating film;
    forming a first composite layer over and in contact with the second conductive layer and the gate insulating film;
    forming a second composite layer over and in contact with the first composite layer and the gate insulating film; and
    forming an organic semiconductor layer over and in contact with the second composite layer and the gate insulating film,
    wherein the first composite layer comprises a first organic compound and a metal oxide which are mixed with each other,
    wherein the second composite layer comprises a second organic compound and a metal selected from an alkali metal and an alkaline-earth metal, and
    wherein the first organic compound and the second organic compound are different from each other.

2. The method according to claim 1,
    wherein the first conductive layer comprises one of tantalum, niobium, aluminum, molybdenum, titanium, or copper.

3. The method according to claim 1,
    wherein the gate insulating film comprises an oxide of a metal which is selected from tantalum, niobium, aluminum, molybdenum, titanium, and copper.

4. The method according to claim 1,
    wherein the gate insulating film comprises a nitride of a metal which is selected from tantalum, niobium, aluminum, molybdenum, titanium, and copper.

5. The method according to claim 1,
    wherein the first organic compound comprises an aromatic amine skeleton.

6. The method according to claim 1,
    wherein the first organic compound is an aromatic hydrocarbon.

7. The method according to claim 1,
    wherein the metal oxide is one or a plurality of oxides of molybdenum, titanium, vanadium, chromium, zirconium, niobium, hafnium, tantalum, tungsten, and rhenium.

8. A method for manufacturing an organic transistor, the method comprising the steps of:
    forming a first conductive layer over a substrate;
    performing plasma treatment on a surface of the first conductive layer to form a gate insulating film;
    forming a second conductive layer over and in contact with the gate insulating film;
    forming a first composite layer over and in contact with the second conductive layer and the gate insulating film;
    forming a second composite layer over and in contact with the first composite layer and the gate insulating film; and
    forming an organic semiconductor layer over and in contact with the second composite layer and the gate insulating film,
    wherein the first composite layer comprises a first organic compound and a metal oxide which are mixed with each other, wherein the second composite layer comprises a second organic compound and a metal selected from an alkali metal and an alkaline-earth metal, and wherein the first organic compound and the second organic compound are different from each other.

9. The method according to claim 8, wherein the first conductive layer comprises one of tantalum, niobium, aluminum, molybdenum, titanium, or copper.

10. The method according to claim 8, wherein the gate insulating film comprises an oxide of a metal which is selected from tantalum, niobium, aluminum, molybdenum, titanium, and copper.

11. The method according to claim 8, wherein the gate insulating film comprises a nitride of a metal which is selected from tantalum, niobium, aluminum, molybdenum, titanium, and copper.

12. The method according to claim 8, wherein the first organic compound comprises an aromatic amine skeleton.

13. The method according to claim 8, wherein the first organic compound is an aromatic hydrocarbon.

14. The method according to claim 8, wherein the metal oxide is one or a plurality of oxides of molybdenum, titanium, vanadium, chromium, zirconium, niobium, hafnium, tantalum, tungsten, and rhenium.

15. A method for manufacturing an organic transistor, the method comprising the steps of:
   forming a first conductive layer over a substrate;
   performing plasma treatment on a surface of the first conductive layer to form a gate insulating film;
   forming a second conductive layer over and in contact with the gate insulating film;
   forming a first composite layer over and in contact with the second conductive layer and the gate insulating film;
   forming a second composite layer over and in contact with the first composite layer and the gate insulating film; and
   forming an organic semiconductor layer over and in contact with the second composite layer and the gate insulating film,
   wherein the first composite layer comprises a first organic compound and a metal oxide which are mixed with each other,
   wherein the organic semiconductor layer comprises the first organic compound,
   wherein the second composite layer comprises a second organic compound and a metal selected from an alkali metal and an alkaline-earth metal, and
   wherein the first organic compound and the second organic compound are different from each other.

16. The method according to claim 15, wherein the gate insulating film comprises an oxide of a metal which is selected from tantalum, niobium, aluminum, molybdenum, titanium, and copper.

17. The method according to claim 15, wherein the gate insulating film comprises a nitride of a metal which is selected from tantalum, niobium, aluminum, molybdenum, titanium, and copper.

18. The method according to claim 15, wherein the metal oxide is one or a plurality of oxides of molybdenum, titanium, vanadium, chromium, zirconium, niobium, hafnium, tantalum, tungsten, and rhenium.

19. The method according to claim 1, wherein the second organic compound has an electron transport property.

20. The method according to claim 8, wherein the second organic compound has an electron transport property.

21. The method according to claim 15, wherein the second organic compound has an electron transport property.

* * * * *